United States Patent
Liang et al.

(10) Patent No.: US 7,666,576 B2
(45) Date of Patent: Feb. 23, 2010

(54) EXPOSURE SCAN AND STEP DIRECTION OPTIMIZATION

(75) Inventors: Fu-Jye Liang, Kaohsiung (TW); Lin-Hung Shiu, Hsinchu (TW); Chun-Kuang Chen, Hsinchu (TW); Tsai-Sheng Gau, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 375 days.

(21) Appl. No.: 11/461,234

(22) Filed: Jul. 31, 2006

(65) Prior Publication Data

US 2007/0285639 A1 Dec. 13, 2007

Related U.S. Application Data

(60) Provisional application No. 60/804,111, filed on Jun. 7, 2006.

(51) Int. Cl.
*G03F 7/20* (2006.01)

(52) U.S. Cl. ..................................... 430/311

(58) Field of Classification Search ................. 430/311, 430/322; 355/30, 53
See application file for complete search history.

(56) References Cited

U.S. PATENT DOCUMENTS

| | | | |
|---|---|---|---|
| 4,924,257 A | 5/1990 | Jain | |
| 5,710,619 A | 1/1998 | Jain et al. | |
| 6,882,477 B1 | 4/2005 | Schattenburg et al. | |
| 2001/0031407 A1* | 10/2001 | Okino et al. | 430/30 |
| 2004/0005507 A1* | 1/2004 | Lakkapragada et al. | 430/30 |
| 2006/0017020 A1 | 1/2006 | Usa et al. | |
| 2006/0082747 A1* | 4/2006 | Fukuhara et al. | 355/53 |
| 2008/0212053 A1* | 9/2008 | Ottens et al. | 355/53 |

* cited by examiner

*Primary Examiner*—Kathleen Duda
*Assistant Examiner*—Brittany Raymond
(74) *Attorney, Agent, or Firm*—Haynes and Boone, LLP

(57) ABSTRACT

A lithography process to pattern a plurality of fields on a substrate is disclosed. The process includes scanning a first field along a first direction using a radiation beam. Thereafter, the processes steps to a second field adjacent the first field and located behind the first field when the first and second fields are viewed along the first direction. The second field is then scanned along the first direction using the radiation beam.

19 Claims, 5 Drawing Sheets

EXPOSURE SCAN AND STEP DIRECTION OPTIMIZATION

CROSS REFERENCE

This application claims priority to U.S. Patent Application Ser. No. 60/804,111 filed on Jun. 7, 2006 which is hereby incorporated by reference.

BACKGROUND

As semiconductor fabrication technologies are continually progressing to smaller feature sizes such as 65 nanometers, 45 nanometers, and below, immersion lithography methods are being adopted. However, during an exposure process using an immersion lithography system, contaminations such as bubbles, particles and water residues can be introduced into the immersion lithography system and further contaminate semiconductor wafers to be processed therein. Such contamination can cause defects and yield degradations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
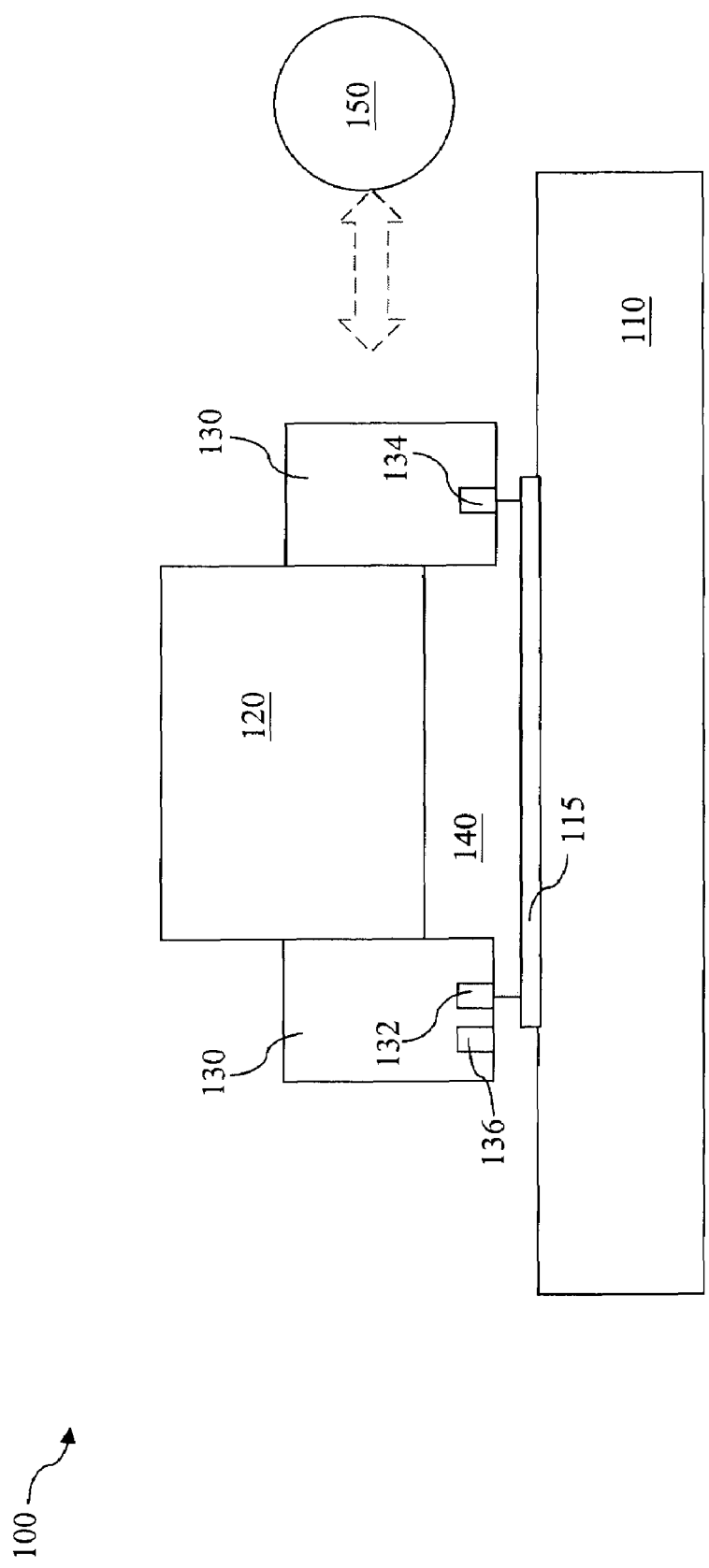
FIG. 1 illustrates a schematic view of one embodiment of an immersion lithography system.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of an embodiment of an immersion lithography system 100. The system 100 includes a substrate stage 110 to hold a substrate 115 to be patterned. The substrate stage 110 is operable to secure and move the substrate 115 relative to the system 100. For example, the substrate stage 110 may be designed to be capable of translational and/or rotational displacement for substrate alignment, stepping, and scanning. The substrate stage 110 may include various components suitable to perform precise movement.

The substrate 115 to be held by the substrate stage 110 and processed by the system 100 may be a semiconductor wafer such as a silicon wafer. Alternatively, the semiconductor wafer may include an elementary semiconductor, a compound semiconductor, an alloy semiconductor, or combinations thereof. The semiconductor wafer may include one or more material layers such as poly-silicon, metal, and/or dielectric, to be patterned. The substrate 115 further includes an imaging layer formed thereon. The imaging layer can be a photoresist layer (resist layer, photo sensitive layer, or patterning layer) that is responsive to an exposure process for creating patterns. The imaging layer may be a positive or negative type resist material and may have a multi-layer structure. One exemplary resist material is chemical amplifier (CA) resist.

The immersion lithography system 100 includes one or more imaging lenses (referred to as a "lens system") 120. The substrate 115 may be positioned on the substrate stage 110 under the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional lens, and may be made of fused silica (SiO2), calcium-fluoride (CaF2), lithium fluoride (LiF), barium fluoride (BaF2), or other suitable material. The materials used for each lens element may be chosen based on the wavelength of light used in the lithography process to minimize absorption and scattering.

The system 100 includes an immersion fluid retaining module 130 operable to hold an immersion fluid 140. The immersion fluid retaining module 130 may be positioned proximate (such as around) the lens system 120 and designed for other functions, in addition to retaining the immersion fluid 140. The immersion fluid retaining module 130 and the lens system 120 make up (at least in part) an immersion head. The immersion fluid 140 may include water (water solution, de-ionized water-DIW, or ultra pure water), high n fluid (with an index of refraction "n" higher than 1.44 at given light wavelength), gas, or other suitable fluid.

The immersion fluid retaining module 130 may include various apertures (or nozzles) for providing an immersion fluid for an exposure process, providing purge air for drying, removing any incoming fluids, and/or performing other functions. Particularly, the module 130 may include an aperture 132 as an immersion fluid inlet to provide and transfer the immersion fluid into a space between the lens system 120 and the substrate 115 on the substrate table 110. The module 130 may include an aperture 134 as an outlet to remove the immersion fluid, or any other fluid to be purged. The module 130 may include an aperture 136 to provide a dry gas for purging any fluid residues and drying the surfaces cleaned.

The immersion lithography system 100 may include a controller 150 designed for controlling various components of the system 100, such as substrate stage 110 and the lens system 120, to perform various actions such as alignment, step movement, scan movement, and immersion fluid disposal. The controller 150 may be incorporated in or integral to a manufacturing executive system (MES). The controller 150 may includes various parts distributed in the system 100 and/or MES. For example, the controller 150 may include hardware such as a microprocessor, semiconductor memory, and communication interfaces. The controller 150 may include preprogrammed software such as macro instructions, microprocessor codes, and recipes. The controller 150 is designed and/or programmed to perform various step-and-scan processes illustrated in FIGS. 4 through 9.

The immersion lithography system 100 may further include a radiation source. The radiation source may be a suitable ultraviolet (UV) or extra UV(EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica (SiO2) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. The mask may be designed with other features and resolution enhancement techniques such as optical proximity correction (OPC) and/or phase shift mask (PSM).

The system 100 described above can be used to perform an immersion exposure process. Alternatively, system 100 can be used for a dry photolithography patterning process and the module 130 may be designed differently or eliminated. The system 100 is operable to expose the imaging layer coated on the substrate 115 using an radiation beam from the radiation source.

Figure 2:
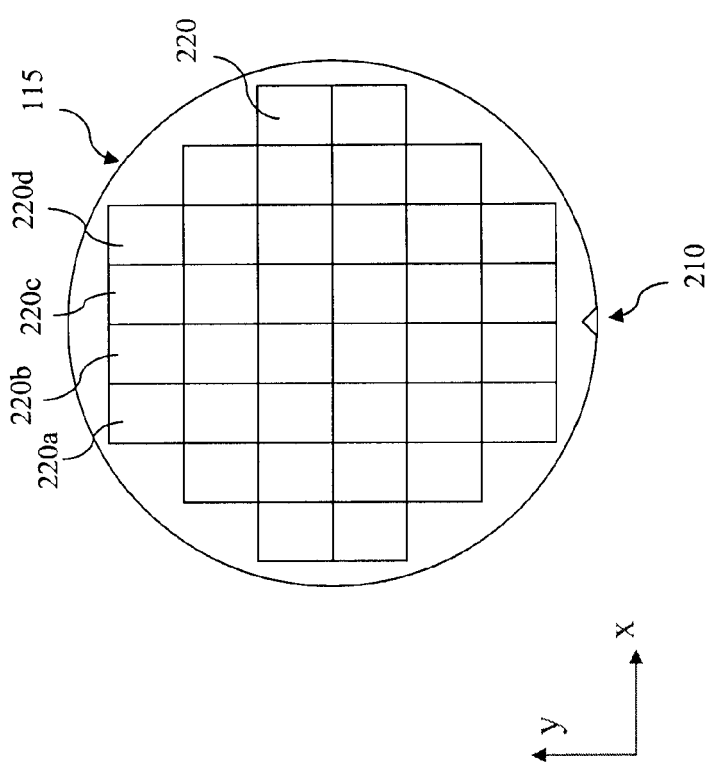
FIG. 2 illustrates a top view of one embodiment of a semiconductor wafer which may be exposed by the immersion lithography system of FIG. 1.

Referring to FIG. 2, illustrated is a top view of one embodiment of the substrate 115 of FIG. 1 and a step-and-scan process. The substrate 115 can be in various dimensions such as about 200 mm or 300 mm in diameter. The substrate 115 may include an orientation feature such as a notch 210. A plurality of areas 220 are defined on the substrate 200 and are referred to as fields such as fields 220a through 220d. A pattern predefined on a reticle or otherwise defined can be formed into each of the fields 220 by a lithography process, referred to as a step-and-scan process. The step-and-scan process is described below with additional reference to FIG. 1.

In the step-and-scan process, the imaging lens system 120 steps the substrate 115 from field to field. After stepping to one field, that field is scanned by a radiation beam to form the predefined pattern thereon. During a step movement, substrate 115, along with the substrate stage 110, is moved such that a next field of the substrate is positioned for scanning. During a scan movement, the substrate 115 and a mask with a predefined pattern to be formed on each field of the substrate, are moved in different directions or a same direction. In the following description, the term "scan movement" represents a movement of the imaging lens system relative to the substrate even though the imaging lens system may not physically move during the scan movement. The associated scan movement direction is defined likewise. Similarly, the term "step movement" represents a movement of the imaging lens system (and also the mask) relative to the substrate even though the imaging lens system (and also the mask) may not physically move during the step movement. However, the phrase "stepping from field to field along a direction" refers to the direction along which a translational movement of the just-scanned field can have that field substantially overlap the adjacent field to be scanned right after.

As one example for illustration, field 220a is scanned along −y direction. The imaging lens system thereafter steps to field 220b from field 220a along x direction. The field 220b is scanned thereafter along y direction. The imaging lens system thereafter steps to field 220c from field 220b along x direction, and thereafter scans field 220c along −y direction. The imaging lens system thereafter steps to field 220d from field 220c along x direction, and thereafter scans field 220d along y direction. The fields 220a through 220d are referred to as a slit since those fields are disposed in a row and scanned sequentially. The imaging lens system then steps to a next slit. Each field in the next slit is scanned sequentially. The step-and-scan process will continue from field to field, from slit to slit until all fields on the substrate are exhausted.

Figure 3:
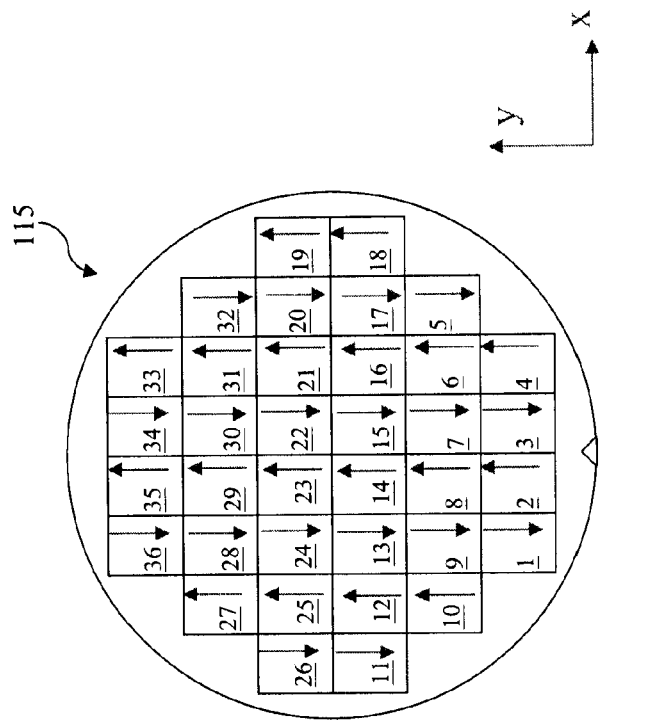
FIG. 3 illustrates a schematic view of a step-and-scan process applied to a semiconductor wafer during a lithography patterning process.

Referring to FIG. 3, illustrated is a top view of the exemplary substrate 115 and a step-and-scan process according to existing practices. The plurality of fields in the substrate 115 are labeled as 1 through 36 according to their scanning sequence. For example, field 1 is first scanned, then field 2, then field 3, and so on until field 36 is scanned. A first slit includes fields 1 through 4, next slit includes fields 5 through 10, and so on. An arrow in each field is used to indicate scan direction. Taking the first slit as an example, field 1 is first scanned along −y direction. Then the imaging lens system steps to field 2 from field 1 along x direction. Then field 2 is scanned along y direction. Then the imaging lens system steps to field 3 from field 2 along x direction and scans field 2, then steps to field 4, and then scans field 4. Then the imaging lens system steps to field 5 in the next slit. A similar step-and-scan process is applied to all fields in this slit is resumed until all fields on the substrate 115 are scanned. According to the described process, the step and scan movements in each slit are perpendicular or approximately perpendicular to each other. However, each step movement in the above-described process can sweep about half width through the just-scanned field and thus has high possibility of introducing and spreading contaminations.

Figure 4:
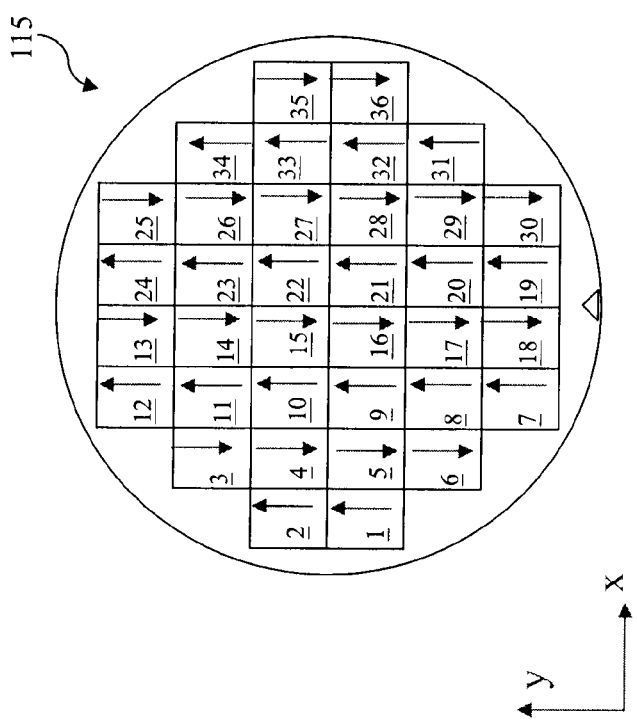

Referring to FIG. 4, illustrated is a top view of an embodiment of the substrate 115 and a step-and-scan process constructed according to aspects of the present disclosure. The fields 1 through 36 on the substrate 115 are labeled according to the scanning sequence. An arrow in each field is used to indicate scan direction. Since all fields in one slit are scanned in a same direction, this direction is referred to as scan direction of that slit. The first slit may include fields 1 and 2. The field 1 is first scanned along y direction. Then the imaging lens system steps to field 2 from field 1 wherein the field 2 is behind field 1 when both fields are viewed along the scanning direction of the first slit. In other words, the imaging lens system steps from field 1 to field 2 along the scanning direction of the first slit. After field 1 has been scanned, the imaging lens system (relative to the substrate) may overshoot a small distance. Thus, during the step movement from field 1 to field 2, the imaging lens system may need back off the small distance such that the imaging lens system is positioned at starting position for scanning field 2. Again, all movements are relatively referred even though the substrate may physically move for example.

Then the imaging lens system steps to field 3 in a second slit, and scans field 3 along −y direction. The imaging lens system then steps to field 4 from field 3 along −y direction, and scans field 4 along −y direction, then steps to field 5 from field 4 along −y direction, and scans field 5 along −y direction, then steps to field 5 from field 4 along −y direction, and scans field 5 along −y direction, and then steps to field 7 in a third slit. A similar step-and-scan process is applied to the third slit, fourth slit, and so on until all slits are exhausted. During the step-and-scan process described above and illustrated in FIG. 4, a step movement from field to field in a same slit has a direction parallel or at least approximately parallel to the scan direction of the slit and a minimized step movement. Therefore, the contamination associated therewith during an immersion lithography process may be reduced or substantially eliminated.

Figure 5:
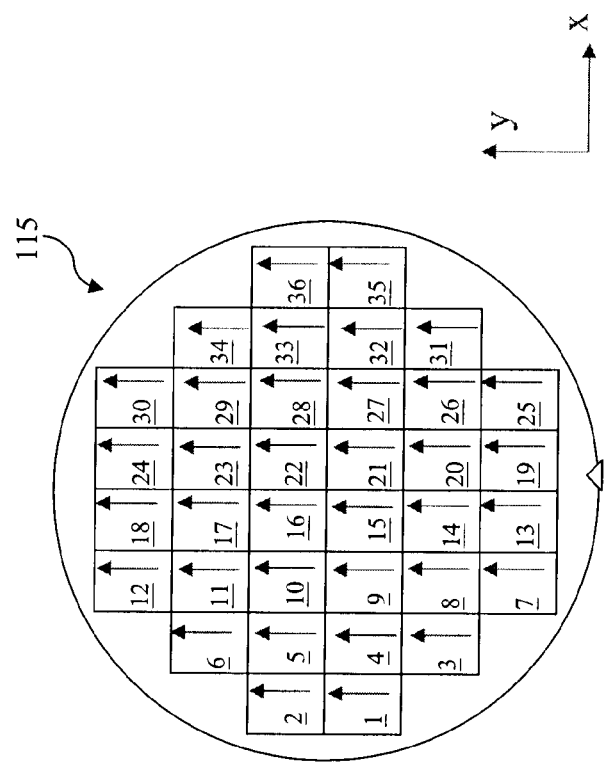
FIGS. 4 through 9 illustrate schematic views of various embodiments of a step-and-scan process applied to a semiconductor wafer during a lithography patterning process constructed according to aspects of the present disclosure.

Another embodiment of the present disclosure is illustrated in FIG. 5 as a top view of the substrate 115. The exemplary fields 1 through 36 on the substrate 115 are labeled according to scanning sequence. An arrow in each field is used to indicate scan direction. The step-and-scan process illustrated in FIG. 5 is similar to the process illustrated in FIG. 4. In both cases, the imaging lens system scans each field in a slit along a one direction and steps from field to field along the same direction. However, the step-and-scan process in FIG. 5 may step from slit to slit differently. Similarly, since a step movement from field to field in a same slit has a minimized step movement, the contamination associated therewith during an immersion lithography process may be reduced or substantially eliminated.

Other embodiments may have various combinations of step-and-scan processes illustrated in FIGS. 4 and 5, respectively. For example, the imaging lens system still scans each field in one slit along one direction and steps from field to field in that slit along the same direction. However, scan movements in adjacent slits may be along the same direction or alternatively along the opposite direction. The step movements from slit to slit are designed differently such that scan movements adjacent slits are in the same direction or alternatively in opposite directions. Similarly, since a step movement from field to field in a same slit has a minimized step movement, the contamination associated therewith during an immersion lithography process may be reduced or substantially eliminated.

Figure 6:
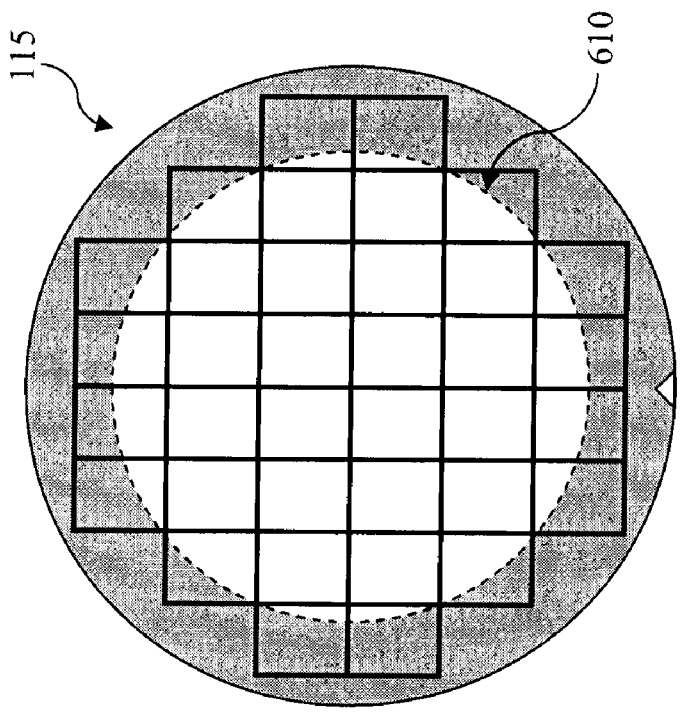

FIG. 6 is a top view of another embodiment of the substrate 115 and an exemplary step-and-scan process constructed according to aspects of the present disclosure. The plurality of fields defined on the substrate 115 are divided into two groups by a line 610 (which is imaginary and is drawn as a broken line therefore). In this example, the line 610 as a circle defines a first group of fields in the internal area enclosed thereby and a second group of fields in or partially in the edge area. Generally, the second group of fields in or partially in a second area defined between the circle 610 and another concentric circle with a radius larger than the circle 610. In one example, the second area may have a width, along the radial direction, about 50 mm. During a step-and-scan process, the first group of fields in the internal area are processed first and the second group of fields in the edge area are processed thereafter. When processing the first group of fields, the step-and-scan process applied to is substantially similar to one of those processes including the process of FIG. 4, the process of FIG. 5, and combinations thereof. For example, when processing the first group of fields, the imaging lens system scans all fields in one slit along one direction and steps from field to field in that slit along the same direction. Scan movements in adjacent slits may be along the same direction or alternatively along the opposite direction. The second group of fields in the edge area are processed in a way such that the step movements from field to field are minimized or step contamination associated therewith is minimized. The step and scan movements applied to the fields in the edge area are processed after the step-and-scan movements applied to the fields in the internal area. Therefore, the contamination associated with the edge is minimized and restrained from impacting the fields in the internal area. Therefore, by applying the described step-and-scan process, the contamination associated with an immersion lithography may be minimized accordingly.

Figure 7:
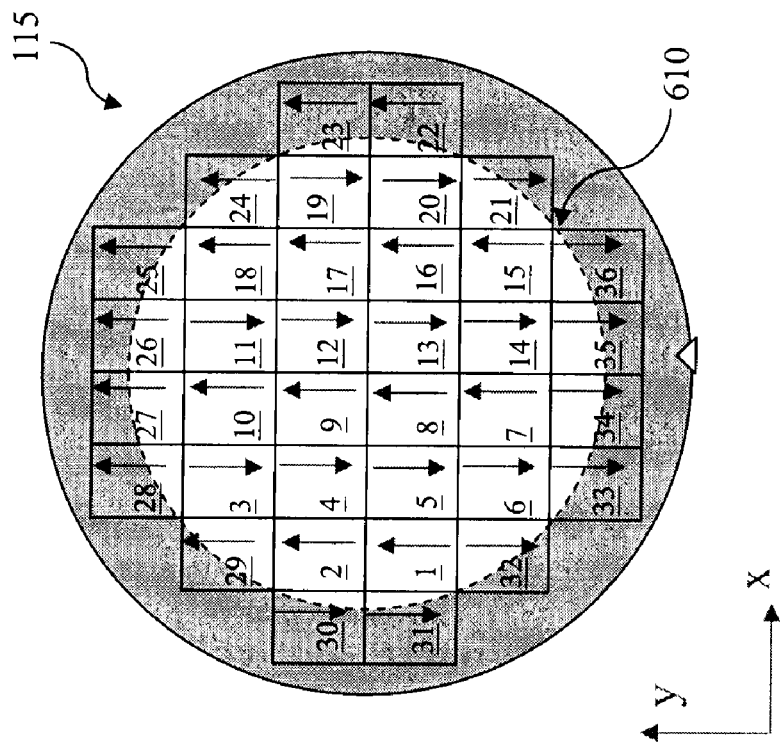

FIG. 7 illustrates an embodiment of the substrate 115 and an exemplary step-and-scan process constructed according to aspects of the present disclosure. The substrate 115 includes a first group in the internal area with exemplary fields 1 through 21, and the second group of fields in the edge area with exemplary fields 22 through 36. All exemplary fields 1 through 36 are labeled according to scanning sequence. An arrow in each field is used to indicate scan direction. The imaging lens system scans the fields in the internal area first in a way similar to the process of FIG. 4 and then scans all fields in the edge area with reduced step movements and reduced step movements over the previously scanned fields.

Figure 8:
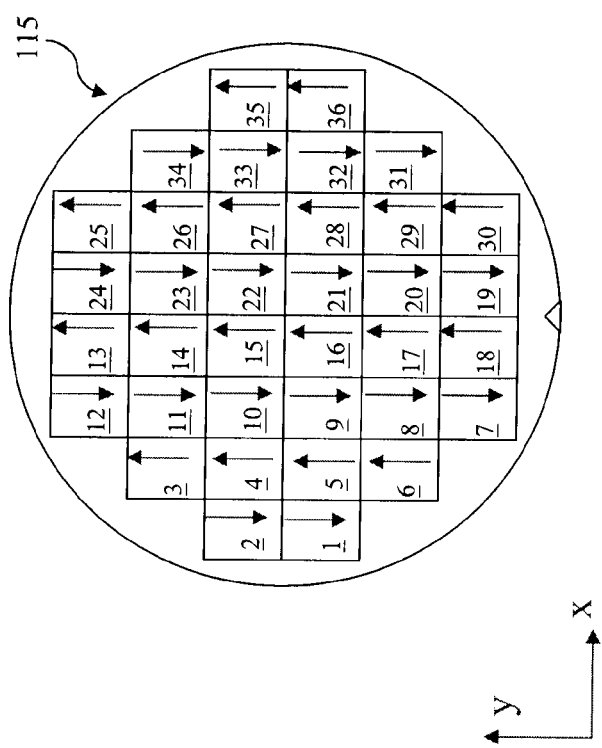

Referring to FIG. 8 as a top view of the substrate 115 having a plurality of fields defined thereon, described is a method of monitoring the contamination introduced by an immersion lithography process. All exemplary fields 1 through 36 are labeled according to scanning sequence. An arrow in each field is used to indicate scan direction. Taking the fist slit having fields 1 and 2 as an example to describe and explain the process, the imaging lens system scans field 1 along –y direction, then steps to filed 2 disposed ahead of field 1 when both are viewed from the scan direction of the first slit (which is –y direction in this example), and then scans field 2 along –y direction. Since a step movement from field to field in a same slit is along a direction opposite the scan direction of the slit, the imaging lens system thus sweeps almost all way over the just scanned field (field 1 in this example) and the field to be scanned right after (field 2 in this example), the contamination from the step movements is enlarged. Therefore, this step-and-scan process may be employed for contamination monitor and control during a lithography manufacturing, especially an immersion lithography manufacturing.

Figure 9:
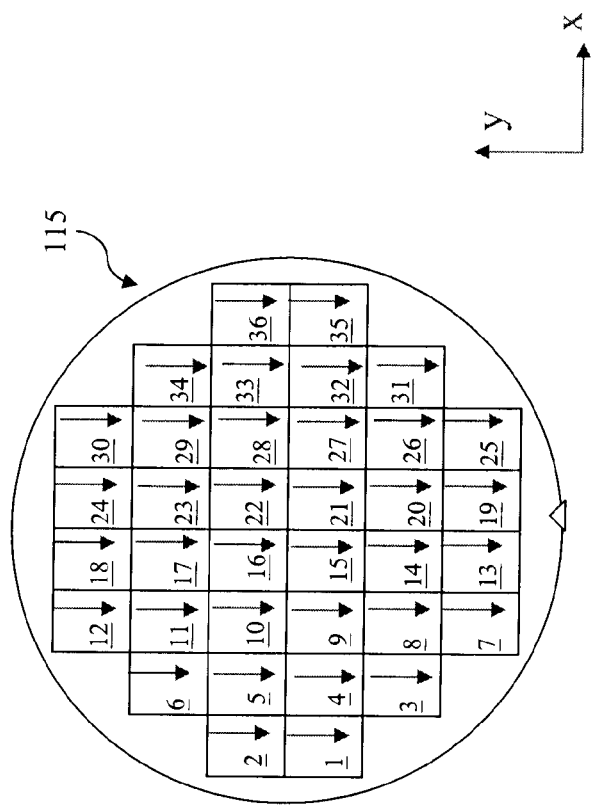

FIG. 9 is another embodiment of the substrate 115 in a top view and the associated step-and-scan process. In FIG. 9, all exemplary fields 1 through 36 are labeled according to scanning sequence. An arrow in each field is used to indicate scan direction. During the step-and-scan process, a step movement from field to field in a same slit is in a direction opposite the scan direction of the slit, the imaging lens system thus sweeps almost all way through the just scanned field and the field to be scanned right after, the contamination from the step movements is enlarged similarly.

In one exemplary method for monitoring contamination, a first substrate is processed by one of those step-and-scan processes illustrated in FIGS. 4 through 7. A second substrate is processed by one of those step-and-scan processes illustrated in FIGS. 8 and 9. Then contaminations from the first and second substrates are measured and compared to extract contamination information, determine contamination level, alert the manufacturing for contamination issues if any trend or out of limit, and/or trigger corrective actions. For example, the described monitoring method may be incorporated into routine qualification procedure such as daily qualification procedure, maintenance qualification procedure, and/or tool qualification procedure. Such method may have other variations. For example, the second substrate may be alternatively processed by the step-and-scan process illustrated in FIG. 3.

Furthermore, the present disclosure may have various variations without departure of the scope and spirit of the disclosure. For example, in the step-and-scan processes illustrated in FIGS. 4 through 7, the imaging lens system scans all fields in a slit along a same direction and steps from field to field along the same direction or alternatively approximately parallel to the same direction, with an angle therebetween less than about 20 degrees. The disclosed processes may be employed in a dry lithography system for a dry lithography process. The notch as an orientation feature shown in each substrate for examples. The notch may be positioned differently relatively the configured fields and slits. The orientation feature may be designed into a different geometry such as a flat. In one example, a step speed may be substantially less than the scan speed, in order to reduce the contamination.

Thus, the present disclosure provides a lithography process to pattern a plurality of fields on a substrate. The process includes scanning a first field along a first direction using a radiation beam; thereafter stepping to a second field adjacent the first field and located behind the first field when the first and second fields are viewed along the first direction; and thereafter scanning the second field along the first direction using the radiation beam.

The present process may further include stepping to a third field adjacent the second field, disposed in a slit with the first and second fields, and located behind the second field when viewed along the first direction; and thereafter scanning the third field along the first direction using the radiation beam. The process may further include patterning a plurality of fields in another slit on the substrate, which includes a set of steps: scanning a fifth field along a second direction using a radiation beam; stepping to a sixth field adjacent the fifth field and located behind the fifth field when the fifth and sixth fields are viewed along the second direction; and scanning the sixth field along the second direction using the radiation beam. The second direction may be proximately parallel to the first direction. The second direction may be alternatively approximately opposite to the first direction. The scanning of the first field or the scanning of the second field may include scanning each field with an immersion fluid disposed between the substrate and an imaging lens system. The radiation beam may include ultraviolet beam. The substrate may further include an imaging layer coated thereon. The stepping to the second field may include stepping to the second field from the first field along a step direction approximately parallel to the first direction. The step direction may approximately parallel to the first direction with an angle therebetween less than about 20 degrees. The substrate may include a semiconductor wafer. The scanning of the first field and the stepping to the second field may include a scan speed and a step speed less than the scan speed.

The present disclosure also provides a lithography process to pattern a substrate. The process includes patterning a first area of the substrate, having a plurality of fields disposed at spaced locations in a slit extending in a first direction, which further includes scanning each field in a direction approximately parallel to the first direction; and stepping from the each field to a next field in a direction approximately parallel to the first direction.

The process may further include thereafter patterning a second area of the substrate, wherein the second area substantially encloses the first area and is proximate to edges of the substrate. The patterning of the second area may include scanning each field and stepping from field to field with minimized step movement. The second area may be defined within two concentric circles. The two concentric circles may have a radius difference less than about 55 mm.

The present disclosure also provides a lithography process for monitoring processing contamination. The process includes patterning a first substrate having a plurality of mutually exclusive fields, including first and second fields that are adjacent. The patterning the first substrate includes effecting for the first field a scan movement having a first magnitude; thereafter effecting a first step movement having a second magnitude; and thereafter effecting for the second field a scan movement having a third magnitude, the second magnitude being substantially less than each of the first and third magnitude. The process also includes patterning a second substrate having another plurality of mutually exclusive fields, including third and fourth fields that are adjacent. The patterning the second substrate includes effecting for the third field a scan movement having a fourth magnitude; thereafter effecting a second step movement having a fifth magnitude; and thereafter effecting for the fourth field a scan movement having a sixth magnitude, the fifth magnitude being substantially more than each of the fourth and sixth magnitude. The process further includes comparing between a contamination result from the first substrate and a contamination result from the second substrate.

In the process, the patterning the first substrate may include effecting for the first field a scan movement along a first direction; effecting the first step movement from the first field to the second field along a second direction proximately parallel to the first direction; and effecting for the second field a scan movement along the first direction. The patterning the second substrate may include effecting for the third field a scan movement along a third direction; effecting a second step movement from the third field to the fourth field along a fourth direction proximately opposite the third direction; and effecting for the second field a scan movement along the third direction.

The present disclosure also provides a lithography apparatus. The apparatus includes an imaging lens system; a substrate stage configured underlying the imaging lens system; and a controller coupled to the imaging lens system and the substrate stage. The imaging lens system, the substrate stage, and the controller are designed and programmed operable to pattern a substrate having a plurality of fields disposed at spaced locations in a slit extending in a first direction by performing scanning each field in a direction approximately parallel to the first direction; and stepping from the each field to a next field in a direction approximately parallel to the first direction. The apparatus may further include a fluid retaining module configured to hold a fluid at least partially filling a space between the imaging lens system and the substrate on the substrate stage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography process to pattern a plurality of fields on a substrate, sequentially comprising:
   scanning a first area of the substrate by:
      scanning a first field along a first direction using a radiation beam;
      stepping to a second field adjacent the first field and located behind the first field when the first and second fields are viewed along the first direction; and
      scanning the second field along the first direction using the radiation beam; and thereafter scanning a second area of the substrate, wherein the second area substantially encloses the first area and is proximate to edges of the substrate, the second area including a third field adjacent one of the first and second fields and aligned in a column or row with the first and second fields, wherein scanning the second area includes:
scanning the third field of the second area in a second direction approximately parallel to and opposite of the first direction using the radiation beam.

2. The process of the claim 1, further comprising:
stepping to a third field adjacent the second field, disposed in a slit with the first and second fields, and located behind the second field when viewed along the first direction; and
scanning the third field along the first direction using the radiation beam.

3. The process of the claim 1, further comprising patterning a plurality of fields in another slit on the substrate, including:
scanning a fifth field along a second direction using the radiation beam;
stepping to a sixth field adjacent the fifth field and located behind the fifth field when the fifth and sixth fields are viewed along the second direction; and
scanning the sixth field along the second direction using the radiation beam.

4. The process of claim 3, wherein the second direction is proximately parallel to the first direction.

5. The process of claim 3, wherein the second direction is approximately opposite to the first direction.

6. The process of claim 1, wherein each of the scanning of the first field and scanning of the second field comprises scanning each field with an immersion fluid disposed between the substrate and an imaging lens system.

7. The process of claim 1, wherein the radiation beam comprises an ultraviolet beam.

8. The process of claim 1, wherein the substrate further comprises an imaging layer coated thereon.

9. The process of claim 1, wherein the stepping to the second field comprises stepping to the second field from the first field along a step direction approximately parallel to the first direction.

10. The process of claim 9, wherein the step direction approximately parallels to the first direction with an angle therebetween less than about 20 degrees.

11. The process of claim 1, wherein the substrate comprises a semiconductor wafer.

12. The process of claim 1, wherein the scanning of the first field and the stepping to the second field comprise a scan speed and a step speed less than the scan speed.

13. A lithography process to pattern a substrate, comprising:
patterning a first area of the substrate, having a plurality of fields disposed at spaced locations in a slit extending in a first direction, including:
scanning each field in a direction approximately parallel to the first direction;
stepping from the each field to a next field in a direction approximately parallel to the first direction; and
thereafter patterning a second area of the substrate, wherein the second area substantially encloses the first area and is proximate to edges of the substrate, the second area including at least one second field forming a part of the slit, wherein patterning the second area includes:
scanning the at least one second field forming a part of the slit in a second direction approximately parallel to and opposite of the first direction.

14. The process of claim 13, wherein the patterning of the second area comprises:
scanning each field; and
stepping from field to field with minimized step movement.

15. The process of claim 13, wherein the second area is defined within two concentric circles.

16. The process of claim 15, wherein the two concentric circles have a radius difference less than about 55 mm.

17. A lithography process for monitoring processing contamination, comprising:
patterning a first substrate having a plurality of mutually exclusive fields, including first and second fields that are adjacent, including:
effecting for the first field a scan movement having a first magnitude;
thereafter effecting a first step movement having a second magnitude; and
thereafter effecting for the second field a scan movement having a third magnitude, the second magnitude being substantially less than each of the first and third magnitude;
patterning a second substrate having another plurality of mutually exclusive fields, including third and fourth fields that are adjacent, including:
effecting for the third field a scan movement having a fourth magnitude;
thereafter effecting a second step movement having a fifth magnitude; and
thereafter effecting for the fourth field a scan movement having a sixth magnitude, the fifth magnitude being substantially more than each of the fourth and sixth magnitude; and
comparing between a contamination result from the first substrate and a contamination result from the second substrate.

18. The process of claim 17, wherein the patterning the first substrate comprises:
effecting for the first field a scan movement along a first direction;
effecting the first step movement from the first field to the second field along a second direction proximately parallel to the first direction; and
effecting for the second field a scan movement along the first direction.

19. The process of claim 17, wherein the patterning the second substrate comprises:
effecting for the third field a scan movement along a third direction;
effecting a second step movement from the third field to the fourth field along a fourth direction proximately opposite the third direction; and
effecting for the second field a scan movement along the third direction.

* * * * *